(12) United States Patent
Govindarajulu

(10) Patent No.: US 8,358,713 B2
(45) Date of Patent: Jan. 22, 2013

(54) HIGH THROUGHPUT AND LOW LATENCY MAP DECODER

(76) Inventor: Sarath Babu Govindarajulu, Irvine, CA (US)

(*) Notice: Subject to any disclaimer, the term of this patent is extended or adjusted under 35 U.S.C. 154(b) by 970 days.

(21) Appl. No.: 12/283,157

(22) Filed: Sep. 10, 2008

(65) Prior Publication Data
US 2009/0067554 A1 Mar. 12, 2009

Related U.S. Application Data

(60) Provisional application No. 60/993,041, filed on Sep. 10, 2007.

(51) Int. Cl.
*H04L 23/02* (2006.01)
*H04L 5/12* (2006.01)
(52) U.S. Cl. .......... 375/265; 375/262; 375/341
(58) Field of Classification Search .......... 375/265, 375/262, 259
See application file for complete search history.

(56) References Cited

U.S. PATENT DOCUMENTS

| | | | |
|---|---|---|---|
| 5,193,094 A | 3/1993 | Viterbi | |
| 5,721,746 A | 2/1998 | Hladik et al. | |
| 5,933,462 A * | 8/1999 | Viterbi et al. | 375/341 |
| 6,192,501 B1 | 2/2001 | Hladik et al. | |
| 6,452,979 B1 | 9/2002 | Ariel et al. | |
| 6,563,877 B1 * | 5/2003 | Abbaszadeh | 375/242 |
| 6,597,743 B1 * | 7/2003 | Khayrallah et al. | 375/265 |
| 6,829,313 B1 * | 12/2004 | Xu | 375/341 |
| 6,980,607 B2 * | 12/2005 | Becker et al. | 375/341 |
| 7,031,406 B1 | 4/2006 | Li et al. | |
| 7,185,260 B2 | 2/2007 | Coombs et al. | |
| 2003/0012311 A1 * | 1/2003 | Becker et al. | 375/341 |
| 2007/0177696 A1 * | 8/2007 | Chen et al. | 375/341 |

OTHER PUBLICATIONS

Ariel et al., "Error-Trellises for Convolutional Codes—Part II: Decoding Methods", IEEE Transactions on Communications, vol. 47, No. 7, 1015-1025 (1999).
Ariel et al., "Error-Trellises for Convolutional Codes—Part I: Construction", IEEE Transactions on Communications, vol. 46, No. 12, 1592-1601 (1998).

* cited by examiner

*Primary Examiner* — David Ometz
*Assistant Examiner* — Qutbuddin Ghulamali
(74) *Attorney, Agent, or Firm* — Lerner, David, Littenberg, Krumholz & Mentlik, LLP

(57) ABSTRACT

In digital communication systems forward error correction coding techniques are typically used to improve the bit error rate performance. The receiver of the digital communication systems employs a decoding apparatus which may use Maximum A posteriori Probability (MAP) algorithm and its variations such as Logarithmic-MAP (Log-MAP), Maximum-Logarithmic-MAP (Max-Log-MAP). MAP decoding apparatus is commonly used as a key component in of decoder for error correcting codes such as convolutional codes and turbo codes. The MAP decoding apparatus computes likelihood estimates as the output. The present invention performs faster MAP decoding by computing likelihood estimates in parallel.

21 Claims, 14 Drawing Sheets

300

HIGH THROUGHPUT AND LOW LATENCY MAP DECODER

CROSS-REFERENCE TO RELATED APPLICATION

The present application claims the benefit of the filing date of U.S. Provisional Patent Application No. 60/993,041, filed Sep. 10, 2007, and entitled "Fast MAP Decoder for Turbo Code Application," the entire disclosure of which is hereby expressly incorporated by reference herein.

BACKGROUND OF THE INVENTION

1. Field of the Invention

The present invention relates generally to digital communication systems that use error correcting codes and, more particularly, to decoders for error correcting codes used in digital communication systems.

2. Description of Related Art

Digital communication systems provide increased robustness to noise and other impairments during propagation compared to analog communication systems. The robustness to noise and other impairments may be further improved in digital communication systems by the use of error correcting codes. Error correcting codes are commonly used in digital communication systems for improving the performance of the system in terms of reduced error rate and/or reduced signal to noise ratio ("SNR"). Error correcting codes introduce redundancy, in a controlled manner, to the data prior to transmission. At the receiver, the structure of the error correcting code and the redundancy in the received data are used to detect and/or correct identified errors.

FIG. 1 shows an exemplary block diagram of a digital communication system 100 that uses error correcting codes. In FIG. 1, the blocks such as the encoder 102, interleaver 104 and modulator 106 are shown as part of a transmit entity 108. The other blocks of the transmit entity 108 such as a controller, data converters, etc., are not shown. In FIG. 1, the blocks such as demodulator 110, deinterleaver 112 and decoder 114 are shown as part of a receive entity 116. The other blocks of the receive entity 116 such as a controller, data converters, etc. are not shown. As used herein, the terms "transmit entity" and "transmitter" are used interchangeably and the terms "receive entity" and "receiver" are also used interchangeably.

At the transmit entity 108, the input data from an information source may be encoded by encoder 102 implementing an error correcting code. In some systems the input data to the encoder of an error correcting code may include an error detection mechanism such as cyclic redundancy code ("CRC"). The encoded data may be further processed before transmission. Often the encoded data may be interleaved to guard against burst errors. The interleaved data is generally modulated by modulator 106 before transmission.

In some communication systems, encoding and modulation may be performed jointly, for example, systems that use Trellis Coded Modulation ("TCM"). The transmitted data may be corrupted by noise and other impairments as it propagates through the communication channel 118. At the receive entity 116, the received data may be processed before passing on to the decoder 114 for error correction. The processing may include demodulating the received data by demodulator 110 and deinterleaving the demodulated data by the deinterleaver 112. The output of the decoder 114 is provided to the other subsystems of the communication system for further processing. For example, the output of the decoder may be checked for its correctness by verifying its CRC.

In general, there are two classes of methods for error correction, namely Forward Error Correction ("FEC") and Automatic Repeat Request ("ARQ"). In a FEC process, the receiver uses the received encoded data and all the information available about the error correction code used by the transmit entity to detect and correct errors that may be present in the received data. In an ARQ process, the receiver detects the errors that may be present in the received data and, if necessary, requests the transmit entity for retransmission to correct the errors. The encoder of FEC error correction method is referred as an FEC encoder and the decoder of an FEC error correction method to detect and correct errors is referred as an FEC decoder.

The data transferred between the transmit entity 108 and the receive entity 116 may represent different types of information such as voice, images, video, computer data, etc. Different types of information is digitized and represented as a bit stream. It is to be understood that the data being transferred between the transmit entity 108 and the receive entity 116 may take different representations during transmission. However, the data at the input of the FEC encoder at the transmit entity 108 is normally a stream of bits and the data at the output of the FEC decoder at the receive entity 116 is normally a stream of bits.

The input and output of an FEC encoder are in the form of bits. In some communication systems, the output of the FEC encoder is mapped to symbols chosen from a constellation of the modulation technique used. For example, a communication system may use Quadrature Phase Shift Keying ("QPSK") modulation. A QPSK constellation is shown in FIG. 2. For the chosen example in FIG. 2, each symbol in the constellation is associated with a group of two bits (i.e., 00, 01, 10 or 11). The output of the interleaver, for example, may be grouped into two-bit vectors and these two-bit vectors may be used to select one of the four symbols from the constellation by the modulator.

The modulated symbol is transmitted through the communication channel. The received symbol at the receiver may be different from the transmitted symbol because as the symbol passes through the propagation channel 118 it may experience different impairments such as fading or multipath interference. At the receiver, the received symbol is processed by the demodulator. The demodulator determines the most likely transmitted symbol based on the received symbol.

The demodulator may operate in a hard decision mode or a soft decision mode when determining the most likely transmitted symbol and its associated bits based on the received symbol. In hard decision mode, the demodulator outputs the exact bit pattern associated with the most likely symbol based on the received symbol. In soft decision mode, the demodulator outputs the likelihood or probability of each bit being a one or a zero. The output of the demodulator in hard decision mode is referred to as "hard bits" whereas the output of the demodulator in soft decision mode is referred to as "soft bits" or "soft metrics."

Soft metric represents the degree of confidence the demodulator has about the value of each bit. The FEC decoder may use this likelihood information during the decoding process. Generally a communication system designed with a demodulator and FEC decoder operating in soft decision mode may provide superior performance than a communication system designed with demodulator and FEC decoder operating in hard decision mode.

Convolutional codes and Turbo codes are two commonly used coding schemes. Convolutional codes are normally specified by a constraint length K of the code, the rate of the code, and generator polynomials. The rate of the code is defined as the ratio of number of input bits to the number of output bits per encoding operation. The generator polynomials specify the connections between different shift register outputs to the adders that generate output bits.

An example of an encoder with constraint length K=3 and rate ½ convolutional code is shown in FIG. 3. For each input bit to the encoder, there are two output bits, namely output bits X and Y as shown in FIG. 3. After encoding each input bit, the content of register $s_1$ is shifted into register $s_0$ and the next input bit is shifted into register $s_1$. The X output bits and Y output bits may be multiplexed into a single stream of bits for further processing such as puncturing, interleaving and modulation at the transmitter. FIG. 3 shows a feed-forward structure of a convolutional code.

Convolutional codes may also be generated using a feedback structure as shown in FIG. 4. Convolutional codes generated using a feedback structure are also referred to as "recursive convolutional codes." When the original input bits are explicitly included without modification into the encoded output bit stream by a code, then the code is referred to as "systematic code." When the original input bits are not explicitly included in the output stream by a code, then the code is referred to as "non-systematic code." The code used by the encoder shown in FIG. 3 is a non-systematic code whereas the code used by the encoder shown in FIG. 4 is a systematic code. The code used by the encoder in FIG. 4 also has a recursive structure and therefore it may be referred to as a Recursive Systematic Code ("RSC").

FIG. 5 illustrates a turbo encoder. The Turbo encoder as shown in FIG. 5 includes a constituent encoder and a turbo interleaver. The constituent encoder may be an FEC encoder such as a convolutional encoder. The input bits to the Turbo encoder are encoded twice as follows. First the input bits are encoded in the same order as they are received, referred to as "normal order," by connecting the switch SW in FIG. 5 to Position 1. When the switch SW is in Position 1, the output bits of the constituent encoder are referred to as parity 1 bits. The Turbo interleaver re-arranges the input bits in a pre-defined manner.

Next the interleaved bits, referred to as "interleaved order," are encoded by connecting the switch SW in FIG. 5 to Position 2. When the switch SW is in Position 2, the output bits of the constituent encoder are referred to as parity 2 bits. The normal order input bits are referred to as systematic bits. The systematic bits are grouped with Parity 1 bits and Parity 2 bits for further processing before transmission. Typically, Turbo codes use RSC codes when convolutional codes are used as constituent codes.

Two commonly used decoding methods for convolutional codes are Viterbi decoding and Maximum A-posteriori Probability ("MAP") decoding. The two different decoding methods are suitable for different applications. Normally the Viterbi decoder accepts soft bits as input and produces hard decision in the form of bits as output. When convolutional codes are used as constituent codes for Turbo codes, the decoders used for convolutional codes may also be used for decoding Turbo codes.

The FEC decoder for Turbo codes is referred to as a Turbo decoder. Turbo decoders may be implemented using different decoding methods depending on the constituent encoder. For a Turbo encoder that uses a convolutional encoder as a constituent encoder, the Turbo decoder may be implemented using MAP decoder, Soft Output Viterbi Algorithm ("SOVA") decoder, etc. The MAP decoder and two of its variants referred to as the Logarithmic-MAP ("Log-MAP") decoder and the Maximum-Logarithmic-MAP ("Max-Log-MAP") decoder are commonly used decoders for decoding Turbo codes.

The received data at the Turbo decoder corresponding to the Turbo encoder shown in FIG. 5 is demultiplexed into systematic bits, parity 1 bits and parity 2 bits and are in the form of soft bits. The received data is organized into two sets. One set of data referred to as "Normal data set," is formed by the systematic bits and parity 1 bits. The second set of data referred to as "Interleaved data set," is formed by the systematic bits and parity 2 bits.

The MAP decoder operates on one data set at a time, either the Normal data set or the Interleaved data set. Performing one MAP decoding operation on one data set is referred herein as an iteration. Turbo decoding consists of successive MAP decoding operations on the Normal data set and on the Interleaved data set alternately. This iterative process improves the probability of correct decision. The Turbo decoding process is illustrated by the functional block diagram as shown in FIG. 6.

The Turbo decoder generally stops processing the received data either after performing a predetermined number of iterations or when some adaptive stopping criteria are met. For example, after each iteration, the minimum absolute value of likelihood ratios as described below may be checked against an empirically determined threshold. If it is above the empirically determined threshold, then the Turbo decoder may stop performing further iterations. The final likelihood ratios of the iterative decoding process are used to make the hard decision about the binary value of the decoded bits.

The operation of the MAP decoder is illustrated by using an example of a convolutional code as the constituent code for the Turbo encoder. The MAP decoder operates according to the trellis structure of the constituent code used by the transmitter. The trellis structure details all possible state transitions of the encoder for a given input symbol and the current state of the encoder.

FIG. 7 illustrates an example of a 4-state trellis structure with 16 stages. The states of the encoder are represented by solid circles in a trellis diagram as shown in FIG. 7. The transitions between different states are shown by lines. A stage represents the transition caused by one or more input bits to the encoder from one state to another state. For a general discussion of trellis diagrams and FEC, see Viterbi, "CDMA—Principles of Spread Spectrum Communication," ©1995, Addison-Wesley Publishing Co., e.g., §5.3.

The MAP decoder computes the estimate of the likelihood for an output bit at a given stage to be one or zero based on the soft bits corresponding to that stage and all the other soft bits before that stage and after that stage. The output of the MAP decoder is generally the decoded bits expressed as likelihood ratios, i.e., the ratio of probability of a particular bit being a one to the probability of that bit being a zero. When decoding convolutional codes using MAP decoder, the likelihood ratios may be used for determining the decoded bits. When decoding Turbo codes using MAP decoder, the likelihood ratios may be used for performing further steps of Turbo decoding.

The likelihood ratios are computed by the MAP decoder using state metrics which are referred to as $\alpha$ state metrics and $\beta$ state metrics for a given stage in the trellis as shown in FIG. 7. The $\alpha$ state metric for a given state represents the probability of the encoder to be in that state for that stage in the trellis based on all the received data before that stage. The $\beta$ state metric for a given state represents the probability of the encoder to be in that state for that stage in the trellis based on all the received data after that stage. The number of $\alpha$ state metrics and $\beta$ state metrics computed at each stage in the trellis is equal to the number of states in the trellis. Computation of α state metrics through the trellis is normally referred to as "Forward recursion" and computation of β state metrics through the trellis is normally referred to as "Backward recursion."

At the receiver, the MAP decoder computes the α state metrics as follows. A branch metric corresponding to a branch that connects two states at a given stage in a trellis is a measure for the likelihood that this branch was taken at the encoder given the received data. For each stage, the MAP decoder computes all possible branch metrics. There are two or more branches merging at each state in a trellis. At a given stage n, the transition probabilities for a branch may be computed by adding the branch metric for the branch merging into a state and the state metric corresponding to the state from which the branch originates at stage n−1. The state metric of a given state at stage n is the sum of the transition probabilities of all the branches merging into that state. The β state metrics may be computed in the same way by traversing the trellis in the backward direction.

The computation of likelihood ratios at a given stage requires both α state metrics and β state metrics for that stage. According to a traditional MAP decoding method, first the α state metrics may be computed using Forward recursion and then β state metrics may be computed using Backward recursion. As the Backward recursion is progressing, since α state metrics for all the stages may be available, the likelihood ratios may be computed simultaneously along with β state metrics computations. Therefore, two separate recursions may be required for one complete MAP decoding operation.

According to another traditional MAP decoding method, first the β state metrics may be computed using Backward recursion and then α state metrics may be computed using Forward recursion. As the Forward recursion is progressing, since β state metrics for all the stages may be available, the likelihood ratios may be computed simultaneously along with α state metrics computation. Therefore, again two separate recursions may be required for one complete MAP decoding operation. In general, for the traditional MAP decoding methods, two separate recursions may be required for one complete MAP decoding operation.

Normally multiple MAP decoding operations may be performed in Turbo decoding on both the Normal data set and the Interleaved data set. Generally larger the number of iterations better the decoding performance for a Turbo decoder. Normally the number of iterations may be chosen depending on the required complexity and performance tradeoff. Normally four to eight iterations may be performed on both the Normal data set and the Interleaved data set. When using eight iterations for a Turbo decoder using a traditional MAP decoding method, there may be 16 MAP decoding operations and this may result in 32 recursions.

Normally, Turbo codes offer improved performance. However, decoders of Turbo codes may have increased latency due to the iterative decoding nature. Furthermore, for high data rate communication systems, the required throughput of the Turbo decoder may be very high. For example, a communication system such as a Wireless Local Area Networks ("WLAN") uses data rates of up to 108 megabits per second. Therefore, new methods and architectures for Turbo decoding that may offer increased throughput and lower latency are highly desirable. Since a MAP decoder is the main part of a Turbo decoder, new methods and architectures for MAP decoders that may offer increased throughput, lower latency and reduced power consumption are highly desirable for high data rate communication systems.

SUMMARY OF THE INVENTION

In accordance with one embodiment of the present invention, a method for decoding a convolutionally encoded message output by an encoder and transmitted over a channel is provided. The encoder output is represented by a trellis having an initial stage and a final stage. Each stage of the trellis has one or more possible states. The method comprises receiving a block of the convolutionally encoded message at a receiver; performing Forward recursion to determine an α state metric for each stage from the initial stage to the final stage in the trellis; performing Backward recursion to determine a β state metric for each stage from the final stage to the initial stage in the trellis; determining likelihood ratios for each stage based upon the α and β state metrics; and outputting the likelihood ratios. The Forward recursion starts from a first bit of the received block of the convolutionally encoded message. The Backward recursion starts from a last bit of the received block of the convolutionally encoded message. And the Backward recursion is performed simultaneously with the Forward recursion.

In one alternative, the method further comprises initiating the likelihood ratio determination when the Forward and Backward recursions reach a midpoint of the trellis. In an example, the Forward recursion simultaneously determines the α state metrics and respective ones of the likelihood ratios for all stages of the trellis between the midpoint and final stage of the trellis. In another example, the Backward recursion simultaneously determines the β state metrics and respective ones of the likelihood ratios for all stages of the trellis between the midpoint and initial stage of the trellis.

In an alternative, the convolutionally encoded message includes multiple blocks of a first size and the method further comprises sub-dividing each block into N sub-blocks of a second size. Here, the β state metric for a given sub-block is determined at least one stage after the end of the given sub-block.

In one example, the at least one stage after the end of the given sub-block comprises M stages, wherein M is a multiple of a constraint length of the trellis. In another example, each sub-block is decoded individually. And in a further example, the α state metrics of the initial stage of the trellis for a given sub-block n are the same as the α state metrics of the final stage of the trellis for the previous sub-block n−1.

In another alternative, if the trellis has an odd number of stages, either the Forward recursion or the Backward recursion is used to determine the likelihood ratios for the middle stage. In this case, the Forward recursion and the Backward recursion may simultaneously derive both the state metrics and the likelihood ratios.

In yet another alternative, the α state metrics for a first half of the trellis and the β state metrics for a second half of the trellis are stored in a state metric memory for determining the likelihood ratios. And in another alternative, the method is implemented in a MAP decoder.

In accordance with another embodiment of the present invention, a decoder is provided for decoding a convolutionally encoded message. The message is output by an encoder and transmitted over a channel. The encoder output is represented by a trellis having an initial stage and a final stage, each stage of the trellis having one or more possible states. The decoder comprises means for receiving a block of the convolutionally encoded message; means for performing Forward recursion to determine an α state metric for each stage from the initial stage to the final stage in the trellis; means for performing Backward recursion to determine a β state metric for each stage from the final stage to the initial stage in the trellis; means for determining likelihood ratios based upon the α and β state metrics; and means for outputting the likelihood ratios. The Forward recursion starts from a first bit of the received block of the convolutionally encoded message. The Backward recursion starts from a last bit of the received block of the convolutionally encoded message. And the Backward recursion is performed simultaneously with the Forward recursion.

In one alternative, the means for determining initiates the likelihood ratio determination when the Forward and Backward recursions reach a midpoint of the trellis. In one example, the decoder simultaneously determines the α state metrics and respective ones of the likelihood ratios for all stages of the trellis between the midpoint and final stage of the trellis. In another example, the decoder simultaneously determines the β state metrics and respective ones of the likelihood ratios for all stages of the trellis between the midpoint and initial stage of the trellis.

In another alternative, the convolutionally encoded message includes multiple blocks of a first size. Here, the decoder further comprising means for sub-dividing each block into N sub-blocks of a second size, wherein the β state metric for a given sub-block is determined at least one stage after the end of the given sub-block. In one example, the at least one stage after the end of the given sub-block comprises M stages, wherein M is a multiple of a constraint length of the trellis.

In a further alternative, the decoder also includes a state metric memory. Here, the α state metrics for a first half of the trellis and the β state metrics for a second half of the trellis are stored in the state metric memory for determining the likelihood ratios.

In a further embodiment of the present invention, a receiver comprises a receive chain and a decoder. The receive chain is for receiving a block of a convolutionally encoded message output by an encoder and transmitted over a channel. The encoder output is represented by a trellis having an initial stage and a final stage. Each stage of the trellis has one or more possible states. The decoder is operatively coupled to the receive chain. The decoder includes means for performing Forward recursion to determine an α state metric for each stage from the initial stage to the final stage in the trellis; means for performing Backward recursion to determine a β state metric for each stage from the final stage to the initial stage in the trellis; means for determining likelihood ratios based upon the α and β state metrics; and means for outputting the likelihood ratios. Forward recursion starts from a first bit of the received block of the convolutionally encoded message. Backward recursion starts from a last bit of the received block of the convolutionally encoded message. And the Backward recursion is performed simultaneously with the Forward recursion.

DETAILED DESCRIPTION

Figure 1:
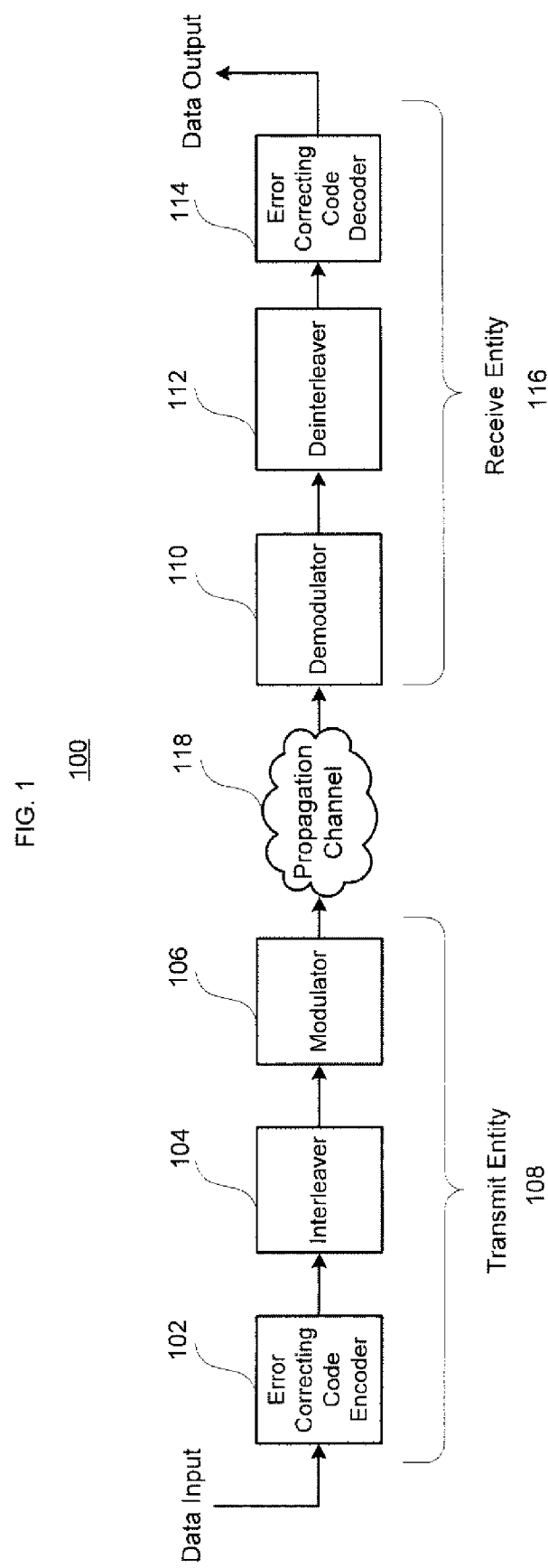
FIG. 1 illustrates a block diagram of a digital communication system.
Figure 2:
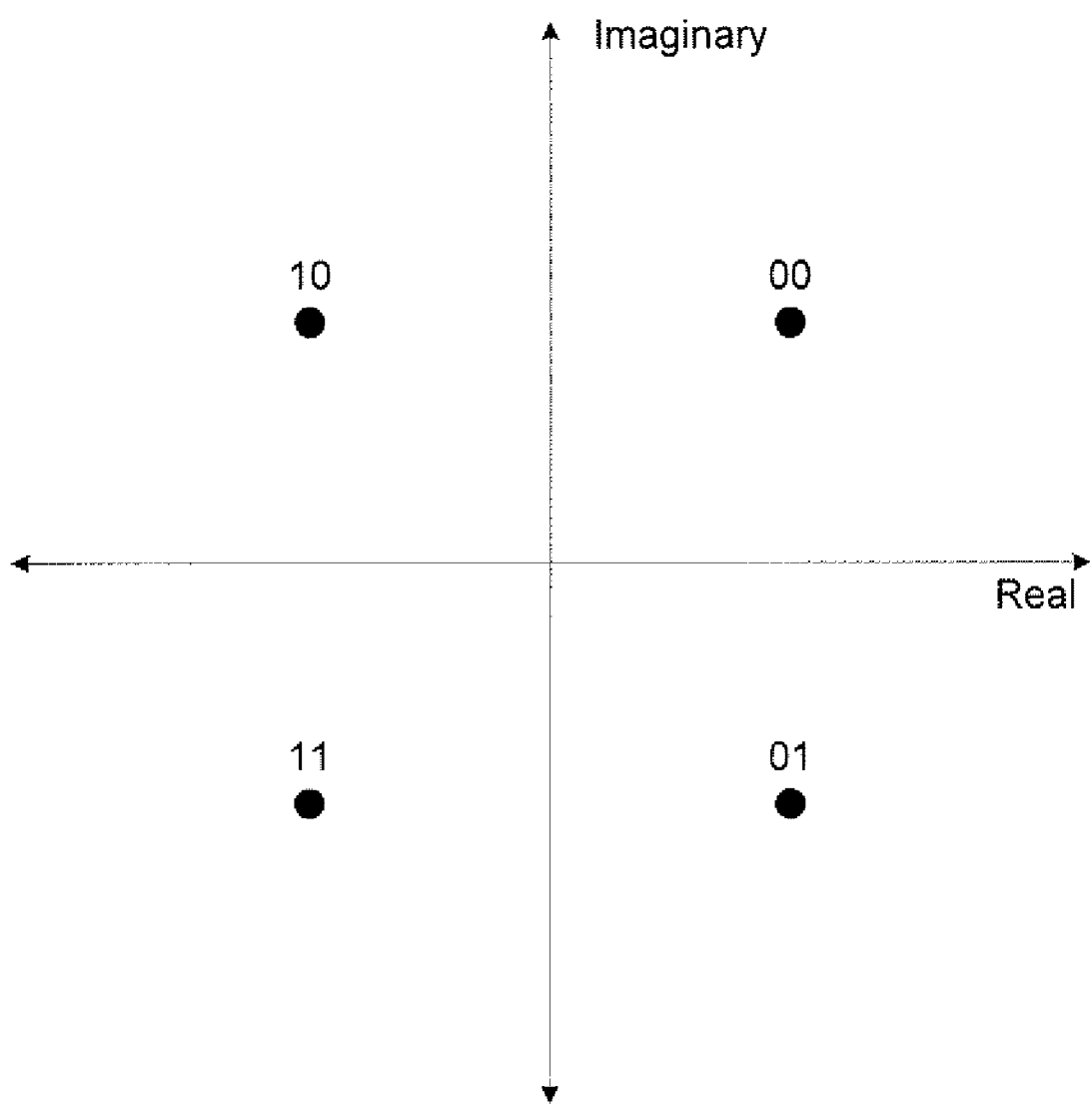
FIG. 2 illustrates the constellation of QPSK modulation communication system.
Figure 3:
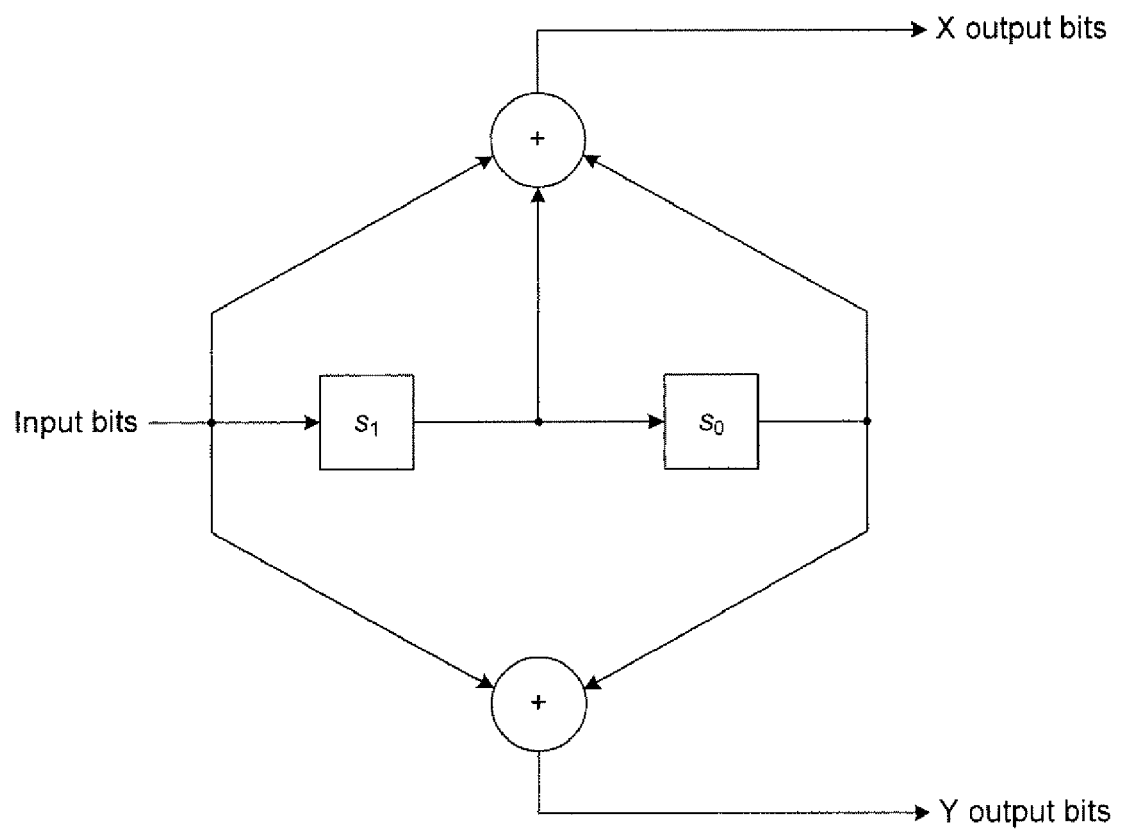
FIG. 3 illustrates convolutional encoder for a rate ½ code and Constraint length K=3.
Figure 4:
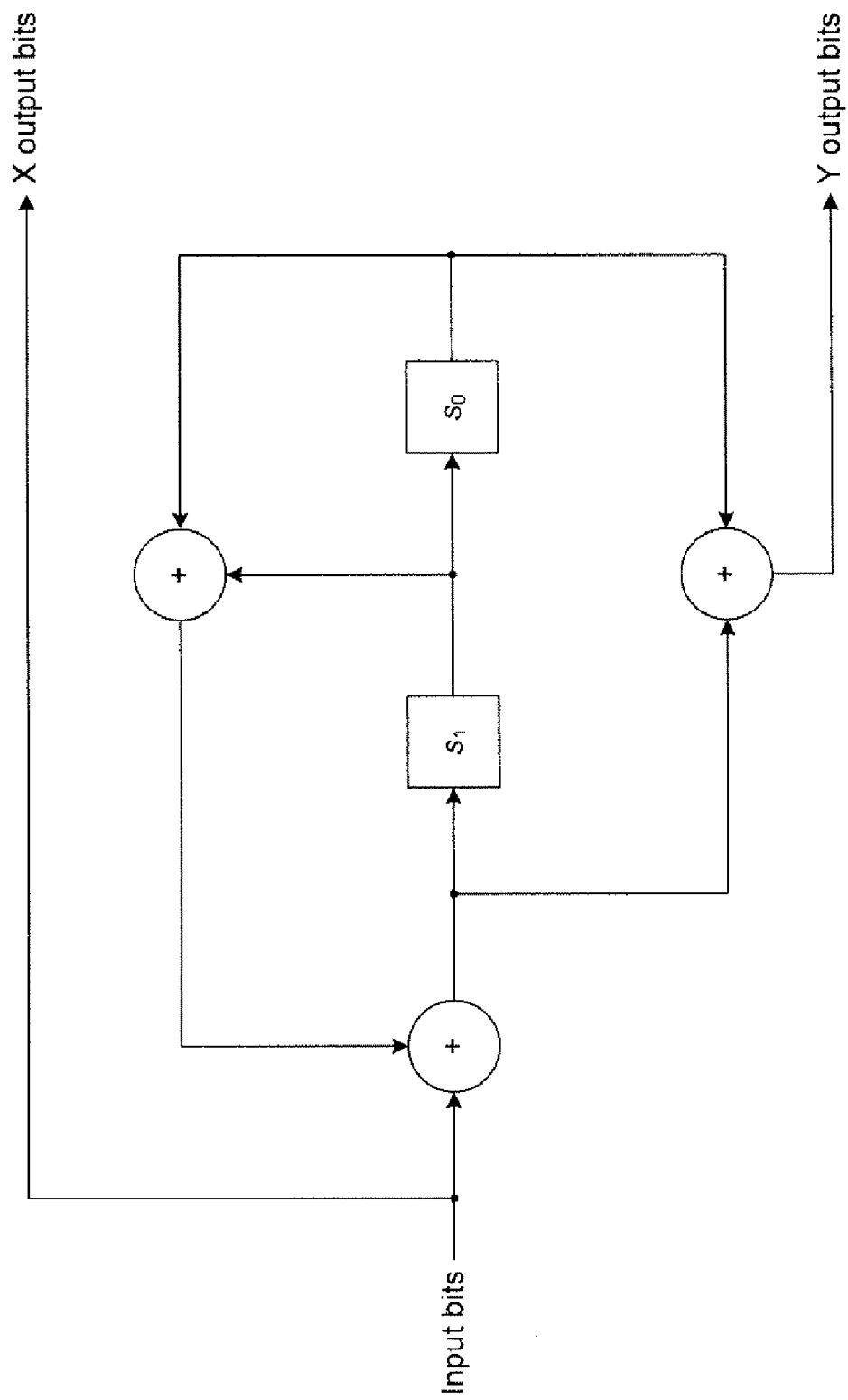
FIG. 4 illustrates a recursive convolutional encoder for a rate M code and Constraint length K=3.
Figure 5:
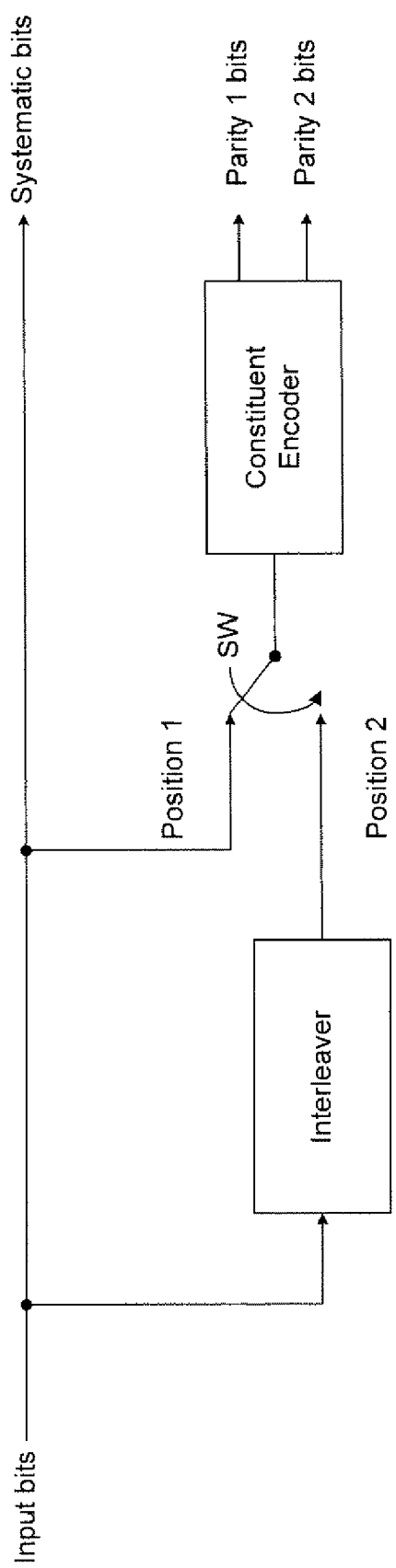
FIG. 5 illustrates a functional block diagram of an encoder for Turbo codes.
Figure 6:
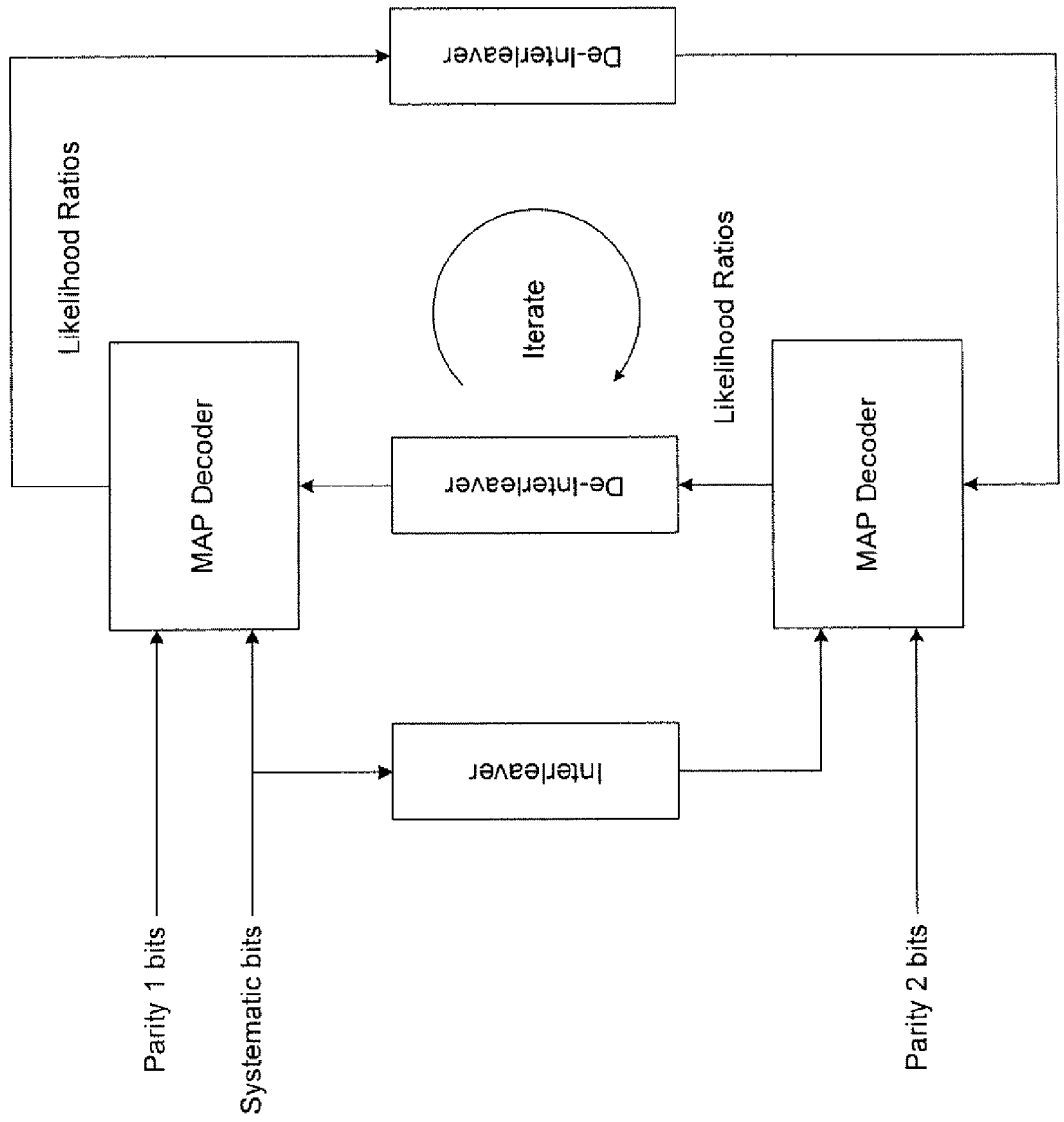
FIG. 6 illustrates a functional block diagram of an iterative Turbo decoder.
Figure 7:
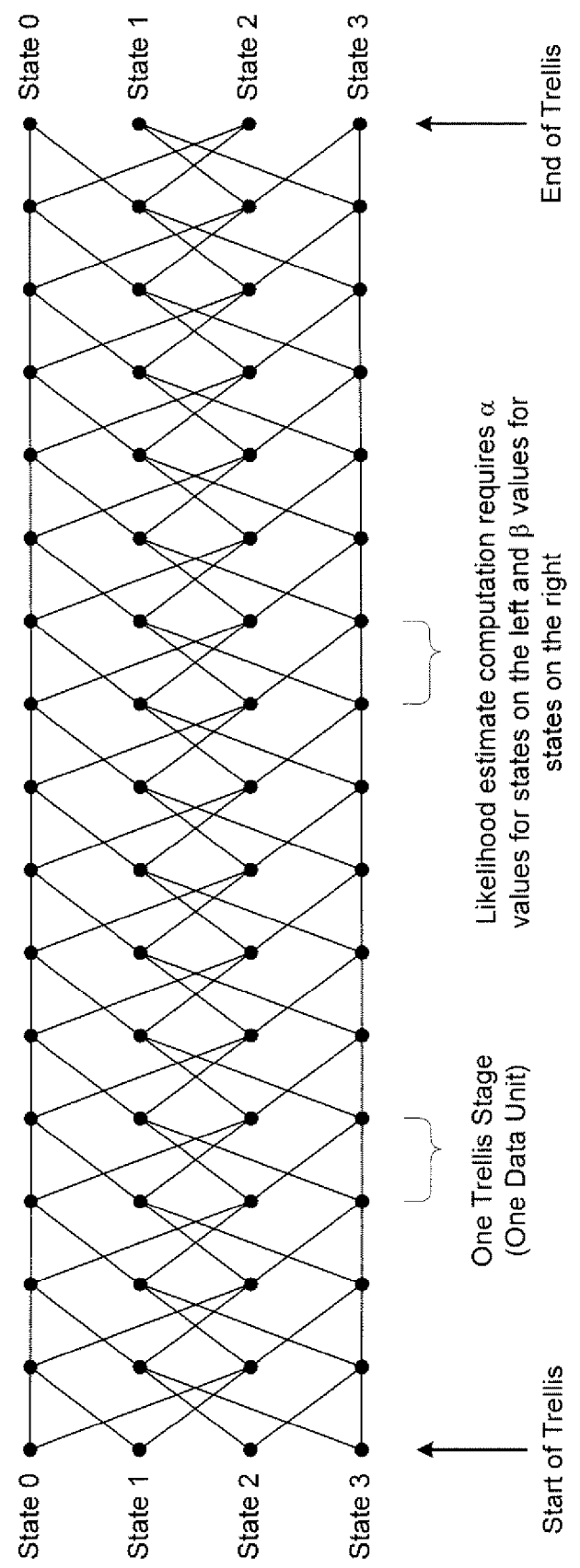
FIG. 7 illustrates a trellis diagram for a convolutional code with Constraint length K=3.

The foregoing aspects, features and advantages of the present invention will be further appreciated when considered with reference to the following description of preferred embodiments and accompanying drawings, wherein like reference numerals represent like elements. In describing the preferred embodiments of the invention illustrated in the appended drawings, specific terminology will be used for the sake of clarity. However, the invention is not intended to be limited to the specific terms used.

Figure 8:
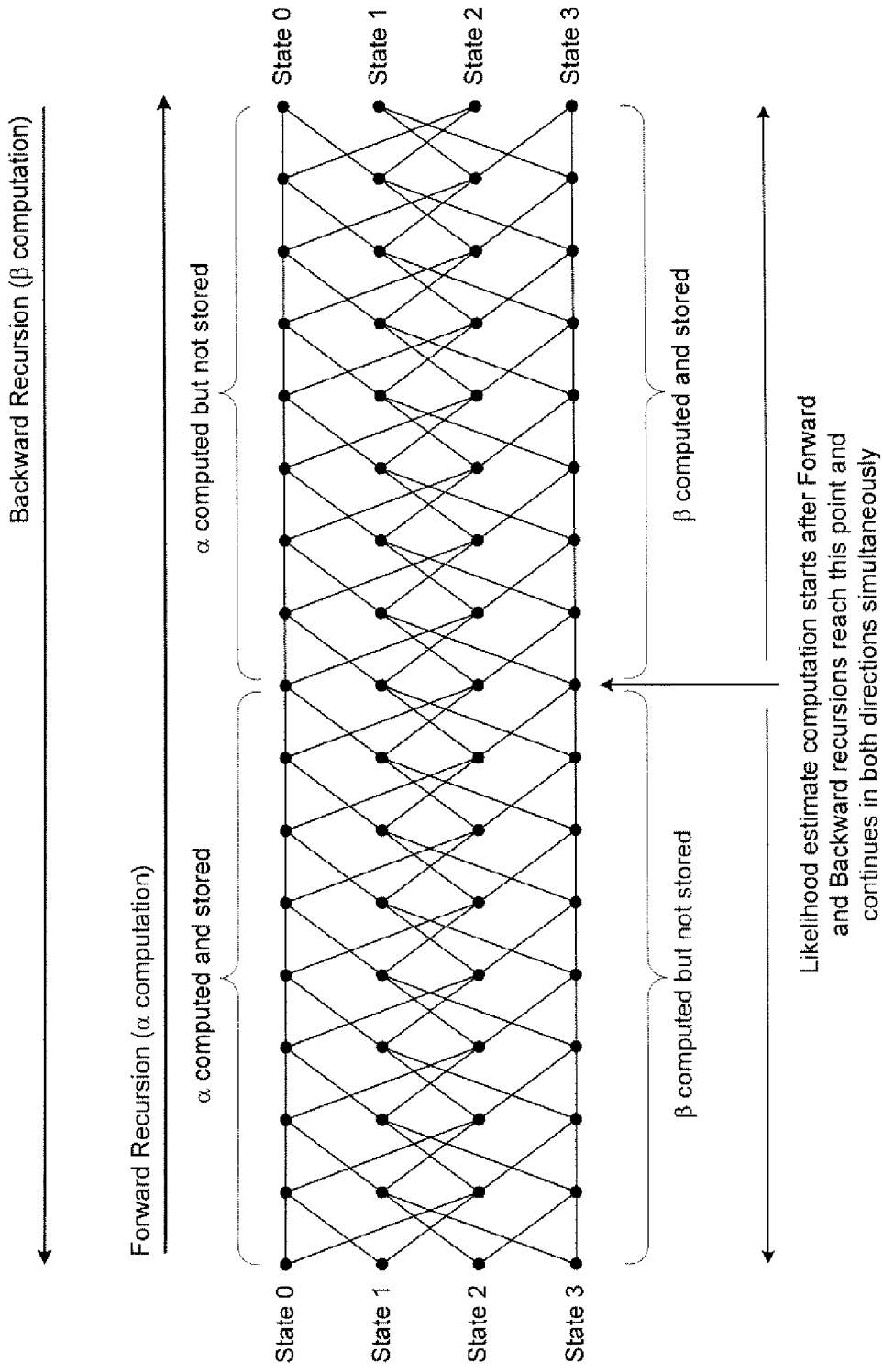
FIG. 8 illustrates a processing flow of a MAP decoder according to the aspects of the present invention.

In accordance with aspects of the present invention, new MAP decoding methods and apparatus for computing likelihood ratios are described. According to one aspect of the present invention, Forward recursion and Backward recursion are performed simultaneously on the same data set. This is illustrated in FIG. 8. The Forward recursion desirably starts processing from the first bit of the received data.

Figure 9:
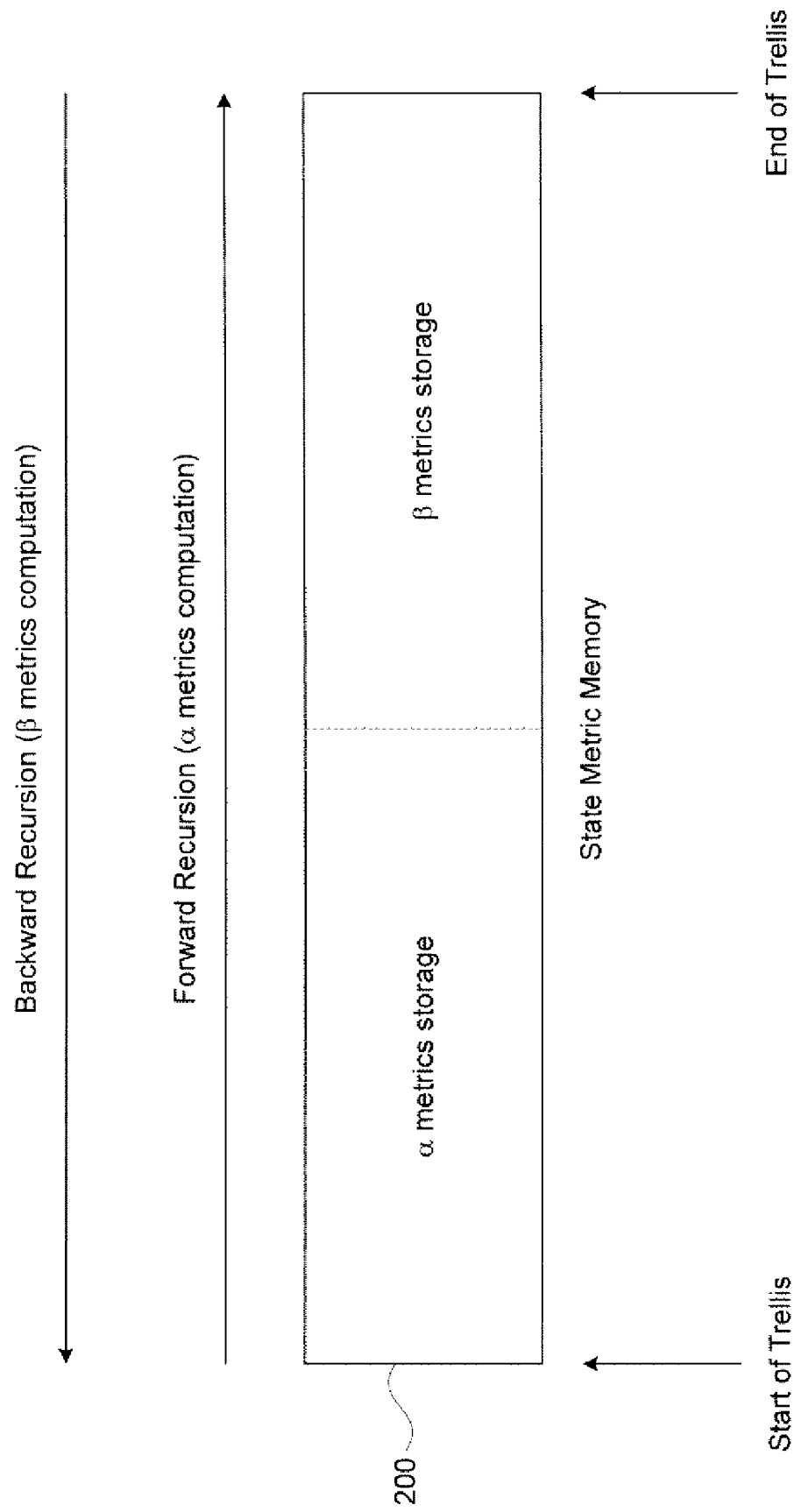
FIG. 9 illustrates aspects of the process flow of FIG. 8.

Backward recursion desirably starts from the last bit of the received data. The α state metrics computed by Forward recursion at each stage are stored in memory 200 as shown in FIG. 9. Similarly, the β state metrics computed by Backward recursion at each stage are stored in the memory 200. The memory 200 for storing the α state metrics and the β state metrics may be a single physical memory unit or may be two or more separate physical memory units. When a single physical memory unit is used, it is preferably a dual port memory.

According to another aspect of the invention, when Forward recursion and Backward recursion reach the middle of the trellis and are about to cross over, the likelihood ratio computations may be started for both Forward recursion and Backward recursion, in addition to the respective state metrics computations, as shown in FIG. 8. For Forward recursion, the α state metrics are computed at each stage as the recursion progresses forward. When Forward recursion reaches the middle of the trellis, the β state metrics are already computed and are available for all the stages that are after the middle of the trellis. Therefore, Forward recursion may simultaneously compute the α state metrics and the likelihood ratios for all the stages between the middle of the trellis and the end of the trellis. For Backward recursion, the β state metrics are computed at each stage as the recursion progresses backward toward the beginning of the trellis.

When the Backward recursion reaches the middle of the trellis, the α state metrics are already computed and are available for all the stages that are before the middle of the trellis. Therefore, Backward recursion may simultaneously compute both the β state metrics and the likelihood ratios for all the stages between the middle of the trellis and the beginning of the trellis. The MAP decoder in accordance with the present invention may compute likelihood ratios for two stages, one in each recursion after Forward recursion and Backward recursion reach the middle of the trellis and are about to cross over.

The required number of memory locations for storing state metrics for the invention described herein remains the same as that of a conventional MAP decoder. In a conventional MAP decoder, the memory is used to store either all the α state metrics if Forward recursion is performed first or all the β state metrics if Backward recursion is performed first. The MAP decoder presented in this invention desirably uses half of the memory for storing α state metrics for the first half of the trellis and the remaining half of the memory for storing the β state metrics for the second half of the trellis.

The present invention is applicable to other forms of MAP decoders as well. For instance, a commonly used alternate form of MAP decoder is the Log-MAP decoder. In this type of MAP decoder, the likelihood ratios are expressed in the logarithmic domain to avoid large numerical dynamic range requirements for the MAP decoder. The likelihood ratios in logarithmic domain are referred to as Log Likelihood Ratios ("LLRs"). Another commonly used alternate form of MAP decoder is the Max-Log-MAP decoder. The Max-Log-MAP decoder is an approximation of the Log-MAP decoder. The Max-Log-MAP decoder reduces the implementation complexity with negligible loss in performance when compared to Log-MAP decoder. The present invention is applicable to MAP decoders, Log-MAP decoders, Max-Log-MAP decoders and other such decoders.

Figure 10:
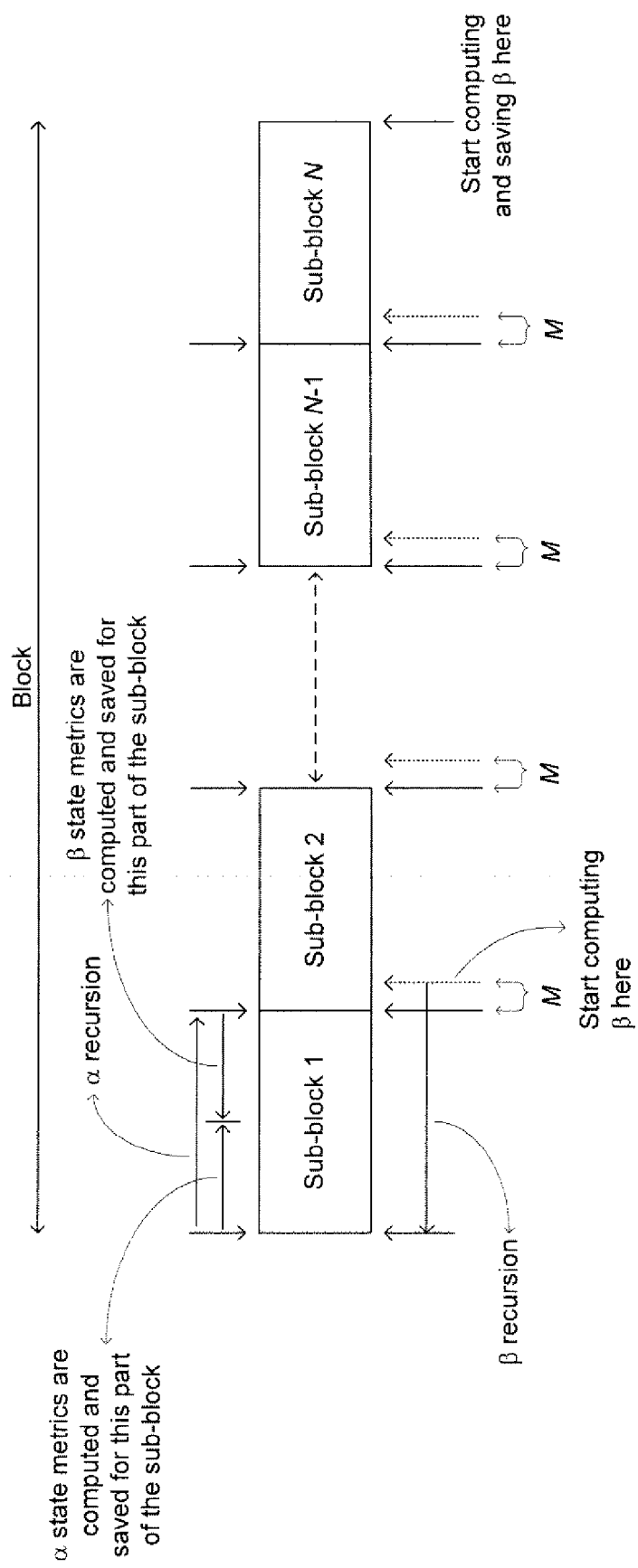
FIG. 10 illustrates a processing flow of a MAP decoder according to the aspects of the present invention when a large block is split into several sub-blocks.

Often the data to be communicated between the transmit entity and the receive entity may be divided into multiple blocks. In some cases the block sizes may be large, such as more than 5000 bits per block. In such cases, the memory storage requirements for the MAP decoder becomes high since the α state metrics and β state metrics may need to be stored for the entire length of the block. Normally, if the block size is large, to reduce the memory requirements the block may be divided into smaller sub-blocks as shown in FIG. 10. When a large block is split into several smaller sub-blocks, the initial values of the α state metrics and the β state metrics for each sub-block may be obtained as follows.

Although the sub-blocks may be processed in any order, for illustration purposes the sub-blocks are shown in the figure as being processed from the first sub-block (sub-block 1) to the last sub-block (sub-block N). The MAP decoder processes each sub-block individually. Since the end of sub-block 1 is not the end of the entire block, the β state metrics computation of sub-block 1 may be started a few stages, e.g., M stages, after the end of sub-block 1.

The basis for this approach is the fact that the β state metrics computation may start in any state at any stage of the trellis. The initial β state metrics generated may not be reliable, but after a few stages the β state metrics may be reliable as if the process had started at the end of the block. The choice of M is typically related to the constraint length K of the convolutional code being used. An empirically determined value for M may be a few constraint lengths. For example, the value of M may be 5×K, where K is the constraint length.

Forward recursion to compute α state metrics for sub-block 1 may start at the first stage of the trellis and Backward recursion to compute β state metrics for sub-block 1 may start at M stages after the end of sub-block 1 as shown in FIG. 10. According to an aspect of the invention, after having established the initial values of β state metrics for sub-block 1 the rest of the processing may proceed in a manner described above for a single block. The β state metrics computed during the first M stages of Backward recursion are for establishing reliable initial values for the sub-block 1. Therefore, it may not be required to store the β state metrics computed during the first M stages of Backward recursion for sub-block 1.

Once a given sub-block of data is processed for likelihood ratios, the entire process may be repeated for the next adjacent sub-block. The initial values of α state metrics for the first stage of the trellis in the next sub-block may be the α state metrics of the final stage of the trellis in the previous sub-block. The initial β state metrics may be computed by performing Backward recursion M stages after the end of the current sub-block in a manner similar to that for sub-block 1. This process may be repeated until the last sub-block of the block is reached. For the last sub-block, Backward recursion to compute β state metrics may be performed in the normal manner as the recursion is starting from the end of the block.

If sub-block N is processed first then Forward recursion to compute α state metrics may be started M stages prior to the actual beginning of sub-block N. If any intermediate sub-block is chosen as the first block to process, then both Forward recursion to compute α state metrics and the Backward recursion to compute β state metrics may be started M stages outside the actual sub-block boundary.

The MAP decoder described in conjunction with the present invention may be applicable to any block size. In a case where the block size is large and it is divided into multiple smaller sub-blocks, the MAP decoding method and apparatus as described herein in the present invention may be applied to each sub-block.

Figure 11:
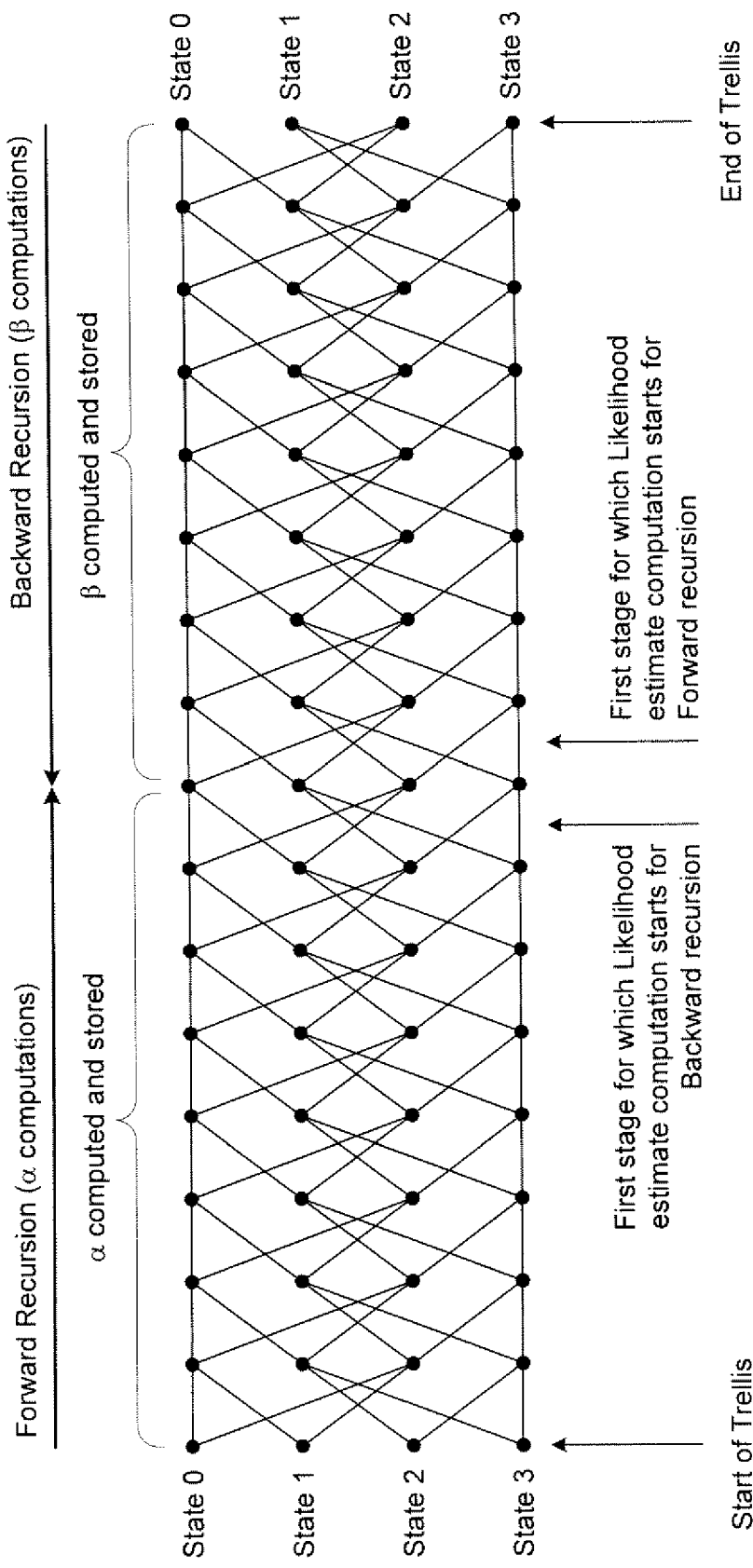
FIG. 11 illustrates a process flow according to the aspects of the present invention for a trellis having an even number of stages.
Figure 12:
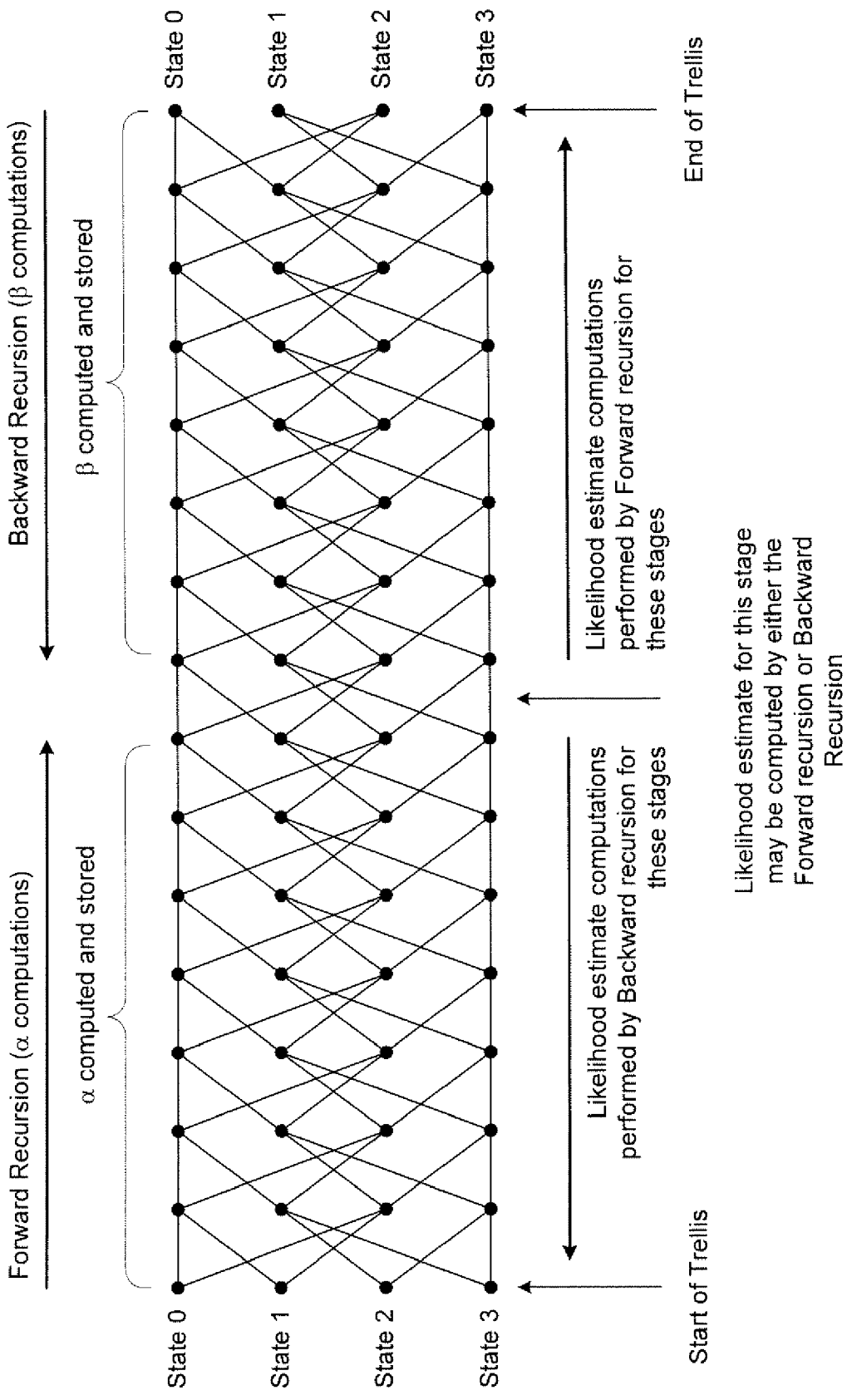
FIG. 12 illustrates a process flow according to the aspects of the present invention for a trellis having an odd number of stages.

If the number of stages in a trellis is even, then Forward recursion and Backward recursion may reach the middle of the trellis at the same time as shown in FIG. 11. Then from this point onwards, both Forward recursion and Backward recursion may simultaneously start computing both state metrics and likelihood ratios. If the number of stages in a trellis is odd, then Forward recursion and Backward recursion may arrive at a trellis stage where both the recursion are able to perform the likelihood ratio computation for that stage as shown in FIG. 12. Both α state metrics and β state metrics are available for that stage. According to an aspect of the invention, either Forward recursion or Backward recursion may perform the likelihood ratio computations for that stage. For the remaining stages, both Forward recursion and Backward recursion may simultaneously compute both state metrics and likelihood ratios.

The MAP decoder configurations described in accordance with the present invention offer the following benefits: reduced latency and improved throughput by computing all likelihood ratios while performing Forward recursion and Backward recursion simultaneously. In Turbo decoding applications, since the MAP decoder is used for several iterations, the benefit of reduced latency may be more significant. Furthermore, power consumption of the decoder may be reduced by turning on the state metrics memory for about half the time when compared to conventional MAP decoders.

Figure 13:
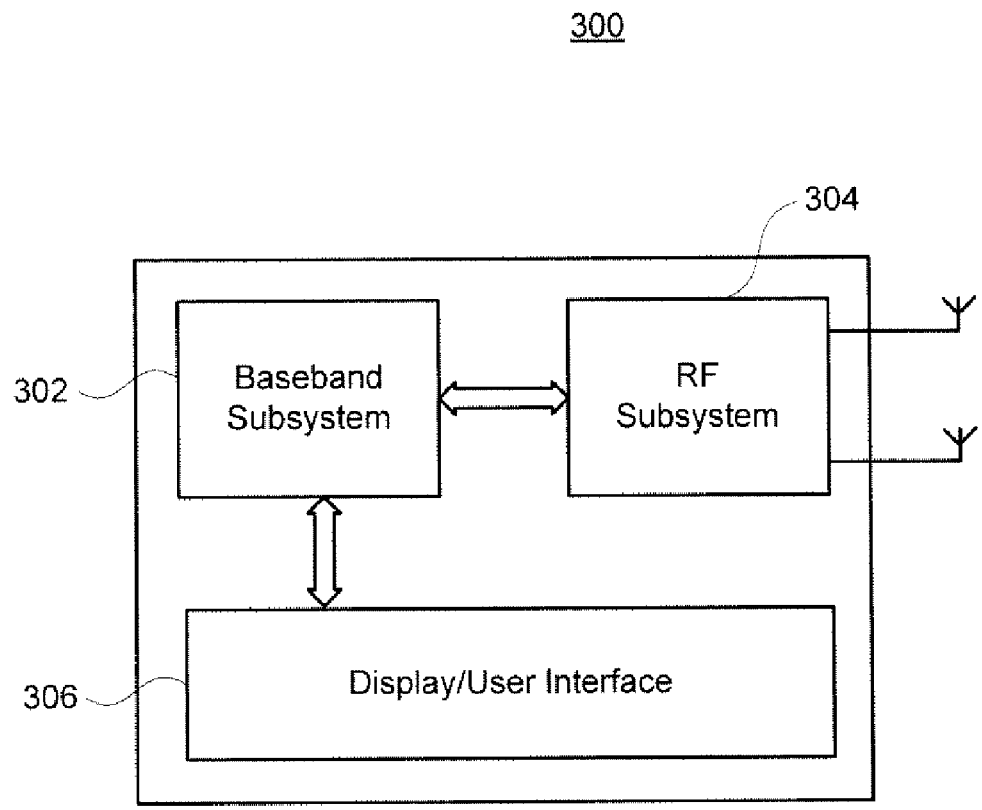
FIG. 13 illustrates a user device for use with aspects of the present invention.

By way of example only, the above-described methods may be implemented in a receiver having a general architecture such as illustrated with regard to receive entity 116 of FIG. 1. The receiver may be a stationary device or a user device such as a wireless mobile station ("MS"), which are collectively referred to herein as client terminals. As shown in FIG. 13, a MS 300 may include a baseband subsystem 302 and a radio frequency ("RF") subsystem 304 for use with a wireless communication network. A display/user interface 306 provides information to and receives input from the user. By way of example, the user interface may include one or more actuators, a speaker and a microphone.

Figure 14:
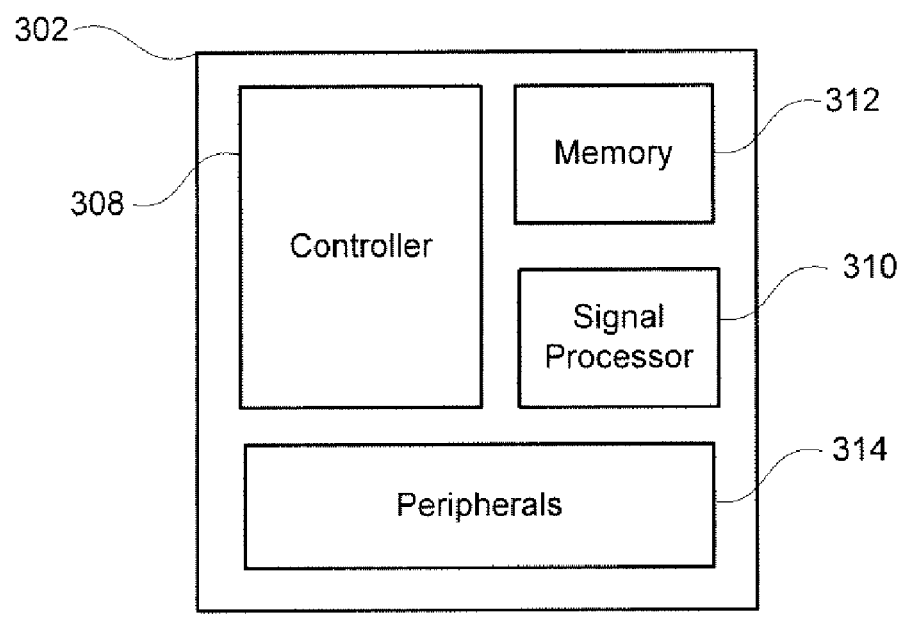
FIG. 14 illustrates a baseband subsystem for the user device of FIG. 13.

The baseband subsystem 302 as shown in FIG. 14 may include a controller 308 such as a microcontroller or other processor. The controller 308 desirably handles overall operation of the MS 300, including management of the RF subsystem 304. This may be done by software or firmware running on the controller 308. Such software/firmware may embody any methods in accordance with aspects of the present invention.

A signal processor 310 may be used to process samples from the RF subsystem 304 or other information sent or received by the MS 300. The signal processor 310 may be a stand-alone component or may be part of the controller 308. Memory 312 may be shared by or reserved solely for one or both of the controller 308 and the signal processor 310. For instance, signal processing algorithms may be stored in a non-volatile section of memory 412 while coefficients and other data parameters may be stored in RAM. Peripherals 314 such as a full or partial keyboard, video or still image display, audio interface, etc may be employed and managed through the controller 308.

The RF subsystem 304 preferably provides two-way communication operation. It may include one or more receivers/receive chains, a transmitter, a synthesizer, a power amplifier, and one or more antennas operatively coupled together to enable communication. The receive chain(s) is operable to receive signals from one or more channels in a wireless communication network.

Aspects of the present invention may be implemented in firmware of the signal processor 310 and/or the controller 308 of the baseband subsystem. In another alternative, aspects of the present invention may also be implemented as a combination of firmware and hardware of the baseband subsystem. For instance, an FEC decoder such as a Viterbi decoder operating as explained herein may be implemented in firmware, hardware and/or software. It may be part of the baseband subsystem, the receiver subsystem or be associated with both subsystems.

In one example, the controller 308 and/or the signal processor 310 may include or control the decoder circuitry. The decoder may be a type of Turbo decoder, such as a Viterbi or MAP decoder. The software may reside in internal or external memory and any data may be stored in such memory. The hardware may be an application specific integrated circuit ("ASIC"), field programmable gate array ("FPGA"), discrete logic components or any combination of such devices. The terms controller and processor are used interchangeably herein.

Figure 15:
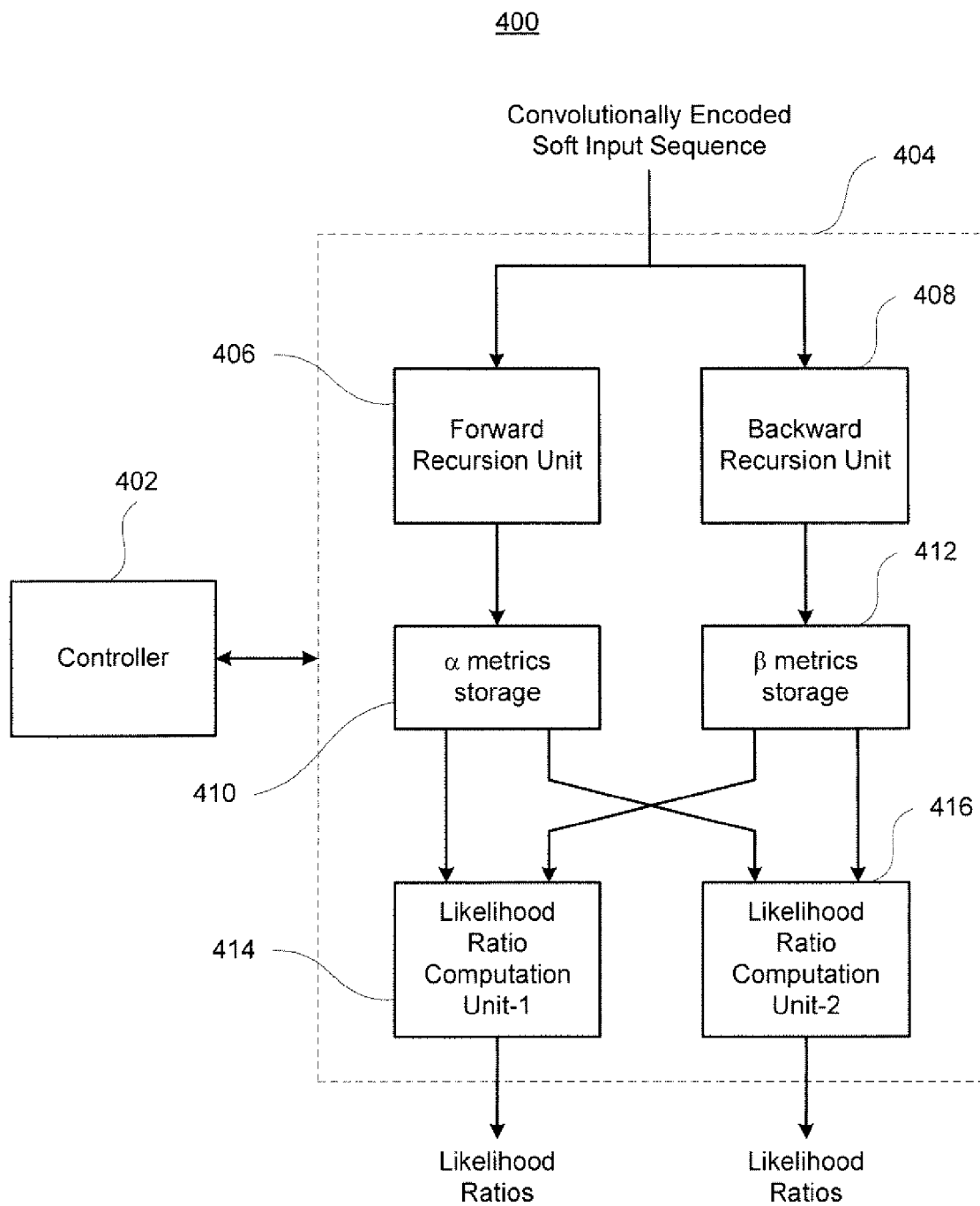
FIG. 15 illustrates a decoder architecture in accordance with aspects of the present invention.

FIG. 15 presents an exemplary decoder architecture 400, which includes controller 402 and decoder 404. While shown as separate elements, as indicated above they may be logically and/or physically incorporated into the same component or set of components, such as controller 308 and/or signal processor 310. The decoder 404 may include a forward recursion unit 406 and a backward recursion unit 408.

The $\alpha$ and $\beta$ metrics may be stored in memories 410 and 412, respectively. These memories may be separate physical memories or logically separate memory spaces. In one example, the $\alpha$ and $\beta$ metrics are stored in memory 200 as shown in FIG. 9.

The decoder 404 may also include a pair of likelihood ratio computation units 414 and 416, as shown. The likelihood ratio computation units 414 and 416 issue likelihood ratios based upon respective $\alpha$ and $\beta$ metrics. The likelihood ratios may be used for further processing if necessary.

In another alternative, aspects of the present invention may be implemented in network elements in addition to or distinct from implementation in mobile stations. For instance, one or more base stations of a wireless communication network may employ a baseband subsystem and/or an RF subsystem such as those detailed above. Software and/or firmware embodying any of the methods in accordance with aspects of the present invention may be executed by a controller or signal processor of the baseband subsystem. In another alternative, aspects of the present invention may also be implemented as a combination of firmware and hardware of the baseband subsystem.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. Aspects of each embodiment may be employed in the other embodiments described herein.

The invention claimed is:

1. A method for decoding a convolutionally encoded block output by an encoder and transmitted over a channel, the encoded block represented by a trellis having an initial stage and a final stage, each stage of the trellis having one or more possible states, the method comprising:
   receiving the block of a convolutionally encoded message at a receiver;
   performing Forward recursion to determine $\alpha$ state metrics for each stage from the initial stage to a middle of the trellis and storing the $\alpha$ state metrics in memory;
   performing Backward recursion to determine $\beta$ state metrics for each stage from the final stage to the middle of the trellis and storing the $\beta$ state metrics in the memory;
   after reaching the middle of the trellis, determining a first likelihood ratio using the stored $\alpha$ state metrics and currently computed $\beta$ state metrics as the Backward recursion continues towards the initial stage of the trellis and simultaneously determining a second likelihood ratio using the stored $\beta$ state metrics and currently computed $\alpha$ state metrics as the Forward recursion continues towards the final stage of the trellis; and
   outputting the first and second likelihood ratios;
   wherein the Forward recursion starts from a first bit of the received convolutionally encoded block, the Backward recursion starts from a last bit of the received convolutionally encoded block, and the Backward recursion is performed simultaneously with the Forward recursion on the same block of the received convolutionally encoded message.

2. The method of claim 1, further comprising, when the Forward recursion and the Backward recursion reach the middle of the trellis and are about to cross over, initiating the likelihood ratio determination by starting the likelihood ratio computations for both the Forward recursion and the Backward recursion.

3. The method of claim 2, wherein the Forward recursion simultaneously determines the $\alpha$ state metrics and respective ones of the likelihood ratios for all stages of the trellis between the midpoint and final stage of the trellis.

4. The method of claim 2, wherein the Backward recursion simultaneously determines the p state metrics and respective ones of the likelihood ratios for all stages of the trellis between the midpoint and initial stage of the trellis.

5. The method of claim 1, wherein the convolutionally encoded block is of a first size, and the method further comprises:
sub-dividing the block into N sub-blocks of a second size, wherein the β state metric for a given sub-block is determined at least one stage after the end of the given sub-block.

6. The method of claim 5, wherein the at least one stage after the end of the given sub-block comprises M stages, and wherein M is a multiple of a constraint length of the trellis.

7. The method of claim 5, wherein each sub-block is decoded individually.

8. The method of claim 5, wherein the α state metrics of the initial stage of the trellis for a given sub-block n are the same as the α state metrics of the final stage of the trellis for the previous sub-block n−1.

9. The method of claim 1, wherein if the trellis has an odd number of stages, either the Forward recursion or the Backward recursion is used to determine the likelihood ratios for the middle of the trellis.

10. The method of claim 9, wherein the Forward recursion and the Backward recursion simultaneously derive both the state metrics and the likelihood ratios.

11. The method of claim 1, wherein the α state metrics for a first half of the trellis and the β state metrics for a second half of the trellis are stored together in a state metric portion of the memory for determining the likelihood ratios.

12. The method of claim 1, wherein the method is implemented in a MAP decoder.

13. The method of claim 1, wherein the convolutionally encoded block is of a first size, the method further comprising:
sub-dividing the block into N sub-blocks of a second size, wherein each encoded sub-block is represented by a sub-trellis having an initial stage and a final stage, each stage of the sub-trellis having one or more possible states;
wherein, for each sub-block, the method includes:
performing the Forward recursion by determining the α state metrics and storing them in the memory for each stage from the initial stage of the sub-trellis to a middle of the sub-trellis;
performing the Backward recursion by determining the β state metrics and storing them in the memory for each stage from the final stage of the sub-trellis to the middle of the sub-trellis;
after reaching the middle of the sub-trellis, a first likelihood ratio is determined as the Backward recursion continues towards the initial stage of the sub-trellis and a second likelihood ratio is determined as the forward recursion continues towards the final stage of the sub-trellis; and
outputting the first and second likelihood ratios;
wherein the Forward recursion starts from a first bit of the received convolutionally encoded sub-block, the Backward recursion starts from a last bit of the received convolutionally encoded sub-block, and the Backward recursion is performed simultaneously with the Forward recursion on the same sub-block of received data.

14. A decoder for decoding a convolutionally encoded block output by an encoder and transmitted over a channel, the encoded block represented by a trellis having an initial stage and a final stage, each stage of the trellis having one or more possible states, the decoder comprising:
means for receiving the block of a convolutionally encoded message;
means for performing Forward recursion to determine α state metrics for each stage from the initial stage to a middle of the trellis and storing the α state metrics in memory;
means for performing Backward recursion to determine β state metrics for each stage from the final stage to the middle of the trellis and storing the β state metrics in the memory;
means for, after reaching the middle of the trellis, (a) determining a first likelihood ratio using the stored α state metrics and currently computed β state metrics as the Backward recursion continues towards the initial stage of the trellis, and (b) simultaneously determining a second likelihood ratio using the stored β state metrics and currently computed α state metrics as the Forward recursion continues towards the final stage of the trellis; and
means for outputting the first and second likelihood ratios;
wherein the Forward recursion starts from a first bit of the received convolutionally encoded block, the Backward recursion starts from a last bit of the received convolutionally encoded block, and the Backward recursion is performed simultaneously with the Forward recursion on the same block of the received convolutionally encoded message.

15. The decoder of claim 14, wherein the means for determining initiates the likelihood ratio determination when the Forward and Backward recursions reach a the middle of the trellis and are about to cross over.

16. The decoder of claim 15, wherein the decoder simultaneously determines the α state metrics and respective ones of the likelihood ratios for all stages of the trellis between the middle of the trellis and the final stage of the trellis.

17. The decoder of claim 15, wherein the decoder simultaneously determines the β state metrics and respective ones of the likelihood ratios for all stages of the trellis between the middle of the trellis and the initial stage of the trellis.

18. The decoder of claim 14, wherein the convolutionally encoded block is of a first size, and the decoder further comprises means for sub-dividing the block into N sub-blocks of a second size, wherein the β state metric for a given sub-block is determined at least one stage after the end of the given sub-block.

19. The decoder of claim 18, wherein the at least one stage after the end of the given sub-block comprises M stages, and wherein M is a multiple of a constraint length of the trellis.

20. The decoder of claim 14, wherein the memory comprises a state metric memory, and wherein the α state metrics for a first half of the trellis and the β state metrics for a second half of the trellis are stored in the state metric memory for determining the likelihood ratios.

21. A receiver, comprising:
a receive chain for receiving a convolutionally encoded block output by an encoder and transmitted over a channel, the encoded block represented by a trellis having an initial stage and a final stage, each stage of the trellis having one or more possible states; and
a decoder operatively coupled to the receive chain, the decoder including:
means for performing Forward recursion to determine α state metrics for each stage from the initial stage to a middle of the trellis and storing the α state metrics in memory;

means for performing Backward recursion to determine β state metrics for each stage from the final stage to the middle of the trellis and storing the β state metrics in the memory;

means for, after reaching the middle of the trellis, (a) determining a first likelihood ratio using the stored α state metrics and currently computed β state metrics as the Backward recursion continues towards the initial stage of the trellis, and (b) simultaneously determining a second likelihood ratio using the stored β state metrics and currently computed α state metrics as the Forward recursion continues towards the final stage of the trellis; and means for outputting the first and second likelihood ratios;

wherein the Forward recursion starts from a first bit of the received convolutionally encoded block, the Backward recursion starts from a last bit of the received convolutionally encoded block, and the Backward recursion is performed simultaneously with the Forward recursion on the same block of the received convolutionally encoded message.

* * * * *